United States Patent
Weichart et al.

(10) Patent No.: US 7,476,301 B2
(45) Date of Patent: Jan. 13, 2009

(54) PROCEDURE AND DEVICE FOR THE PRODUCTION OF A PLASMA

(75) Inventors: Jürgen Weichart, Fürstentum (LI); Dominik Wimo Amman, Fürstentum (LI); Siegfried Krassnitzer, Feldkirch (AT)

(73) Assignee: Oc Oerlikon Balzers AG, Furstentum (LI)

( * ) Notice: Subject to any disclaimer, the term of this patent is extended or adjusted under 35 U.S.C. 154(b) by 48 days.

(21) Appl. No.: 10/256,718

(22) Filed: Sep. 27, 2002

(65) Prior Publication Data
US 2003/0075522 A1 Apr. 24, 2003

(30) Foreign Application Priority Data
Sep. 28, 2001 (DE) .............................. 101 47 998

(51) Int. Cl.
C23C 14/00 (2006.01)
(52) U.S. Cl. ................................. 204/192.13
(58) Field of Classification Search ............ 156/345.38, 156/345.48; 216/67
See application file for complete search history.

(56) References Cited

U.S. PATENT DOCUMENTS

| 5,551,959 | A | * | 9/1996 | Martin et al. ................. 51/295 |
| 5,581,155 | A | * | 12/1996 | Morozov et al. ....... 315/111.21 |
| 6,022,460 | A | * | 2/2000 | O et al. ................... 204/298.06 |
| 6,030,667 | A | * | 2/2000 | Nakagawa et al. .......... 427/569 |
| 6,238,528 | B1 | * | 5/2001 | Xu et al. ................. 204/192.12 |
| 6,300,720 | B1 | * | 10/2001 | Birx ....................... 315/111.21 |
| 6,375,810 | B2 | * | 4/2002 | Hong ..................... 204/192.12 |
| 6,409,890 | B1 | * | 6/2002 | Grunes et al. .......... 204/192.12 |
| 6,432,260 | B1 | * | 8/2002 | Mahoney et al. ....... 156/345.35 |
| 6,497,796 | B1 | * | 12/2002 | Ashtiani et al. ........ 204/192.12 |
| 6,740,842 | B2 | * | 5/2004 | Johnson et al. ......... 219/121.54 |
| 6,824,658 | B2 | * | 11/2004 | Gopalraja et al. ...... 204/298.06 |
| 2003/0116427 | A1 | * | 6/2003 | Ding et al. ............. 204/192.17 |
| 2004/0094509 | A1 | * | 5/2004 | Miyata et al. .................. 216/70 |

FOREIGN PATENT DOCUMENTS

JP 10284298 A * 10/1998

* cited by examiner

*Primary Examiner*—Allan Olsen
(74) *Attorney, Agent, or Firm*—William L. Androlia; H. Henry Koda

(57) ABSTRACT

The present invention concerns a procedure for the production of a plasma that is at least co-produced in the vacuum chamber (1a) of a vacuum recipient (1) of a device suitable for plasma processing with at least one induction coil (2) carrying an alternating current, where the gas used to produce the plasma is fed into the vacuum chamber (1a) through at least one inlet (3) and the vacuum chamber (1a) is subject to the pumping action of at least one pump arrangement (4), and where a possibly pulsed direct current is also applied to the induction coil (2) in order to influence the plasma density.

15 Claims, 2 Drawing Sheets

PROCEDURE AND DEVICE FOR THE PRODUCTION OF A PLASMA

AREA OF THE INVENTION

The present invention concerns a procedure for the production of a plasma produced by means of an induction coil in the vacuum chamber of a vacuum recipient, as well as a device suitable for carrying out the procedure in accordance with the invention. The invention further concerns the use of the procedure in accordance with the invention for providing a substrate with a possibly reactive coating or performing a possibly reactive etching on such a substrate.

BACKGROUND OF THE INVENTION

When substrates are reactively processed in a vacuum, as is the case—for example—in semiconductor production, it is customary to employ a plasma produced in the vacuum chamber of a vacuum recipient for a multitude of process steps, cases in point being the possibly reactive coating or the possibly reactive etching of a substrate.

In this connection it is known that the plasma can be produced by inductive and/or capacitative means.

EP 0 271 341 A1, for example, describes a device for the dry etching of semiconductor disks that comprises an induction coil for plasma production and an electrode device for extracting ionized particles from the plasma onto the substrate. In the device described in U.S. Pat. No. 6,068,784, again, energy for plasma production is inductively coupled into the vacuum chamber of the vacuum recipient by means of a coil-type antenna, the vacuum chamber in this case serving as reactor. The substrate is situated on an electrode that serves as substrate carrier and to which there is applied a so-called RF (radio frequency) bias or polarizing potential.

U.S. Pat. No. 5,460,707 describes a device for capacitative plasma production that can also be used for coating purposes. A magnetic field—produced by an additional permanent or electromagnet—may be provided in this case for controlling the plasma density distribution or producing a locally greater plasma density.

When substrates are subjected to vacuum processing, as is the case—for example—in semiconductor production, it is very important to have an extremely uniform plasma density distribution over the entire surface of the substrate in order to assure an appropriately uniform substrate processing. To this end it is essential to screen or compensate all disturbing external influences, especially external fields.

Although, for example, it is theoretically possible to use a ferromagnetic shell to screen the vacuum recipient, this is rather disadvantageous from a practical point of view, because such a shell would considerably increase the weight of the vacuum recipient. Furthermore, it would become more difficult to gain access to the vacuum recipient whenever maintenance or repair work has to be carried out.

EP 0 413 283 teaches that a planar plasma can be obtained by means of an electrically conductive planar pancake coil, the induction field being produced by connecting a high-frequency voltage source to the pancake coil and coupled in through a dielectric screening.

U.S. Pat. No. 6,022,460 suggests that a further magnetic field—produced by a pair of Helmholtz coils—should be allowed to act on the plasma, which can be inductively produced (or at least co-produced), for example, by means of either a pancake coil to which there is applied a high-frequency alternating voltage or a coil in the form of a vacuum bell. Applied to the pair of Helmholtz coils is a direct and alternating current combination such as to produce a weak magnetic field that is modulated by the alternating current component, said modulation being described as a "shaking" of the magnetic field". According to the patent in question, this serves essentially to obtain an increase of the plasma density and an improvement of the uniformity of the plasma.

One drawback of the device for the production of a plasma described in U.S. Pat. No. 6,022,460 consists of the fact that the additional pair of Helmholtz coils makes it more difficult to obtain a compact design and also increases the cost of the device. Since considerations of high-frequency technology require the induction coil to be decoupled from the pair of Helmholtz coils, it is absolutely essential that the induction coil should be spatially separated from the Helmholtz coils.

The present invention therefore sets out to make available a procedure and a device for the production of a high-density plasma that would either avoid the described drawbacks associated with the state of the art or be affected by them only to a lesser extent. Further tasks of the present invention will be brought out by the detailed description thereof given hereinbelow.

BRIEF DESCRIPTION OF THE INVENTION

The present invention concerns a procedure for the production of a plasma that is at least co-produced in the vacuum chamber (1a) of a vacuum recipient (1) by means of at least one induction coil (2) carrying an alternating current, where the gas used to produce the plasma is allowed to enter the vacuum chamber (1) through at least one inlet (3) and the vacuum chamber (1a) is subject to the pumping action of at least one pump arrangement (4) and where—for the purposes of influencing the density of the plasma—a possibly modulated and preferably pulsed direct current is passed through the induction coil (2).

The present invention further concerns the use of the procedure in accordance with the invention for the possibly reactive coating and or the possibly reactive etching of substrates (9).

The invention further concerns a device suitable for plasma processing that comprises at least one induction coil (2) for at least co-producing the plasma in the vacuum chamber (1a) of a vacuum recipient (1), where the vacuum chamber (1a) is provided with at least one inlet (3) for admitting the gas serving for the production of the plasma and a pump arrangement (4), and where the induction coil (2) is connected to one or more voltage generators that supply the induction coil with an alternating current and a direct current, the latter possibly pulsed in a unipolar or a bipolar manner.

DETAILED DESCRIPTION OF THE INVENTION

Figure 1:
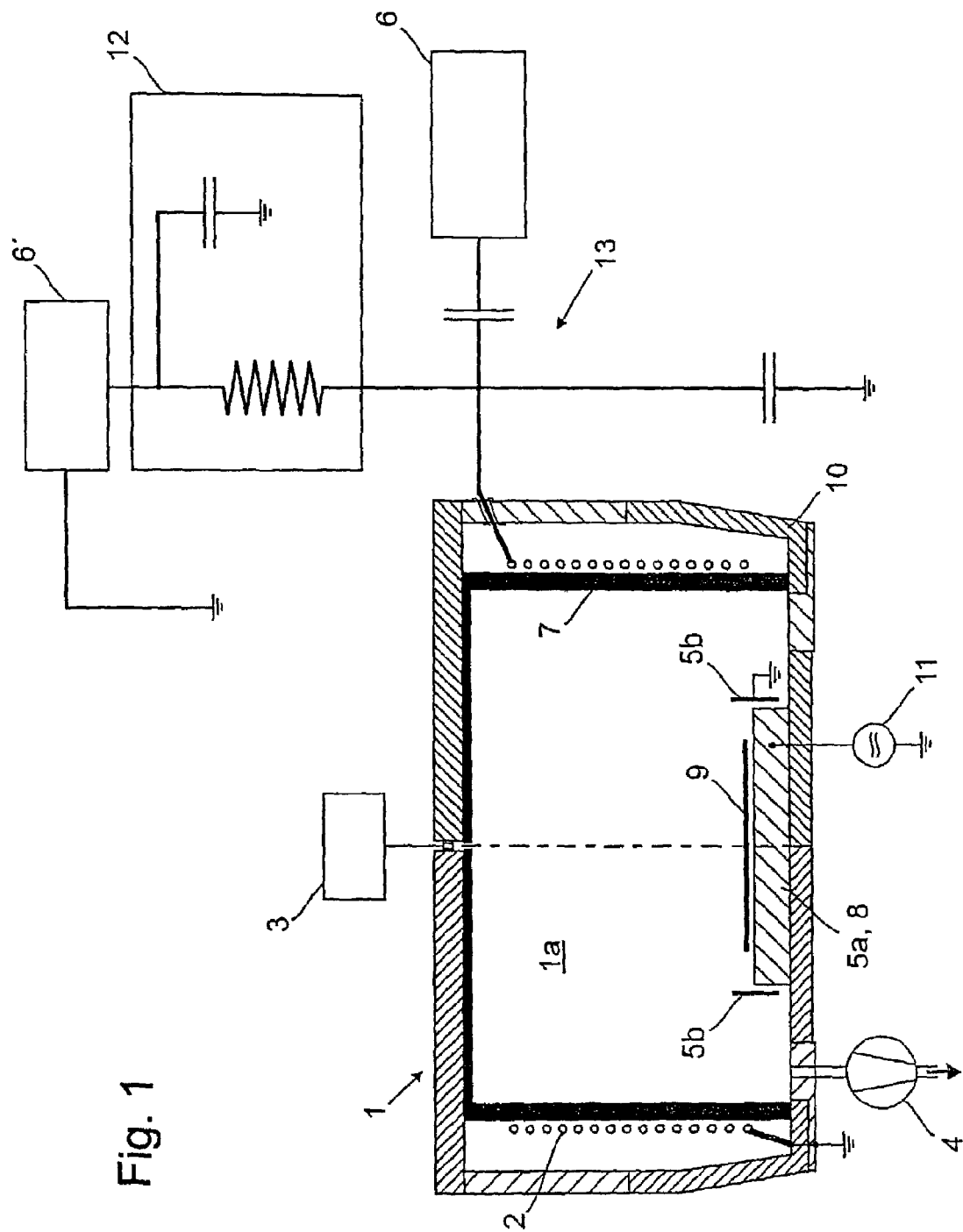
FIG. 1 shows a schematic representation of a device in accordance with the invention suitable for plasma processing.

The device in accordance with the invention suitable for plasma production comprises a vacuum recipient 1 with a vacuum chamber 1a that can be evacuated by means of one or more pump arrangements 4.

In a preferred embodiment the vacuum recipient 1 comprises an outer casing 20 made of such metals as, for example, stainless steel or aluminium in order to assure good sealing of the vacuum recipient and to screen it, especially against stray external fields On the vacuum side the metal casing 10 of the vacuum recipient 1 may preferably be provided with a dielectric inner casing 7 that could be, for example, either self-supporting or applied as a coating to the inside of the outer casing 10. The dielectric material is preferably chosen in such a way as to be not only as inert as possible with respect to the gases used for reactive coating and etching processes, gases that may contain such elements as chlorine and fluorine, but also as permeable as possible as far as the coupled power is concerned. Preferred dielectric materials comprise, among others, polymeric materials, especially ceramic materials, quartz and aluminium oxide. But it is also possible, for example, for only the side wall of the vacuum recipient 1 to be either wholly or partly lined or coated with dielectric material or to be made of a dielectric material, while both the upper and the lower faces are provided with metallic connections (couplings) as described in WO 00/19,483. The vacuum recipient 1 described in EP 0 413 283 is provided with a dielectric screening that may be contained, for example, in the upper cover wall of the vacuum recipient 1.

The above description of the vacuum recipient 1 is to be understood as a mere example and is intended to explain the invention, but not to limit it.

The vacuum chamber 1a contains one or more gas inlets 3 that serve to admit the gas used for the production of the plasma. The gas, which may consists of a single gaseous compound or also of a mixture of several gaseous compounds, is chosen by taking due account of the chemical composition and the physical parameters of the substrate 9 that is to be processed and the modification of the substrate surface that is to be obtained. If the surface of the substrate is to be cleaned (sputter etching), the gas may contain, for example, argon or some other inert gas, while the gases used for reactive etching processes may contain, for example, chlorine ($Cl_2$), silicon tetrachloride ($SiCl_4$), boron trichloride ($BCl_3$), carbon tetrafluoride ($CF_4$), trifluoromethane ($CHF_3$), sulphur hexafluoride ($SF_6$) and/or oxygen ($O_2$). When substrates have to be coated with thin films (for example, by means of chemical vapour deposition—CVD or plasma enhanced chemical vapour deposition—PECVD), it is possible to use organometallic compounds, methane ($CH_4$), silicon hydride ($SiH_4$), ammonia ($NH_3$), nitrogen ($N_2$) or hydrogen ($H_2$). The aforementioned gaseous compounds and processes for the processing of substrates 9 are once again to be understood as examples and intended solely to explain the invention, not to limit it.

The flow of the gases and the power of the pumping arrangement(s) 4 are preferably chosen in such a manner as to make the pressure in the vacuum chamber 1a of the vacuum recipient 1 come to lie especially between 0.01 and 10 Pa and preferably between 0.05 and 0.02 Pa.

The device in accordance with the invention contains at least one induction coil 2 by means of which the plasma produced in the vacuum chamber 1a of the vacuum recipient 1 is at least co-produced. The induction coil(s) 2 is/are preferable arranged in the vacuum recipient 1 and/or the vacuum chamber 1a in such a manner as not to be exposed to the plasma, thereby avoiding, for example, the deposition of electrically conducting interference coatings or other coatings on the induction coil(s) 2 or damage of the induction coil(s) 2 caused by the plasma. The induction coil(s) 2 is/are preferably separated by means of dielectric screening (for example: a dielectric inner casing 7) from at least the part of the vacuum chamber 1a in which the plasma is produced. The induction coil(s) 2 may preferably be arranged also outside the vacuum chamber 1a.

The device in accordance with the invention contains one or more induction coils 2, preferably one or two induction coils 2, and especially one induction coil 2.

The form of the induction coil(s) 2 may vary and is preferably chosen in such a manner that as uniform as possible an induction field is obtained even without causing a direct current to pass through the induction coil(s) 2.

In a preferred embodiment of an induction coil 2 said coil comprises windings that are wound directly on the vacuum chamber 1a and/or preferably on a dielectric internal casing 7 situated inside the chamber. In the device in accordance with the invention that is schematically illustrated by FIG. 1 the coil windings are wound, for example, on the side walls of the dielectric internal casing 7. In this case the uniformity of the induction field can be influenced, for example, by the number and the arrangement of the windings of the induction coil(s) 2 and the geometric dimensions of the dielectric internal casing 7.

In another embodiment the induction coil 2 assumes the form of a flat (pancake) or planar coil that may consist, for example, of a number of spiral-shaped windings or a series of windings arranged in concentric circles, as described in EP 0 413 282. The flat coil could, for example, have a preferably circular or ellipsoidal form. The concept "flat" or "planar" means that the ratio between the thickness of the coil and the extent of the coil in the two other directions at right angles to the thickness is smaller than 0.3 and, preferably, smaller than 0.2. EP 0 413 282 discloses that the pancake coils are preferably arranged close to a dielectric screening in the outer casing 10 of the vacuum recipient, said screen acting as a dielectric window and permitting the coupling of the induction field. It is, of course, also possible to arrange the flat coil close to the dielectric inner casing 7.

In another preferred embodiment the induction coil 2 has the form of a vacuum bell as disclosed in U.S. Pat. No. 6,022,460.

It has been found that the density of the plasma at least co-produced by mans of the induction coil(s) 2 can be influenced and that, in particular, the uniformity of the plasma can be increased when to the induction coil(s) 2 there is applied not only an alternating current, but also and at the same time a direct current.

The application to the induction coil(s) 2 of an alternating current serves to couple the high-frequency power into the vacuum recipient for at least the co-production of the plasma. For this purpose the induction coil 2 is connected to a high-frequency voltage generator 6, preferably through an adapter network 13. The adapter network 13 serves to adapt the original resistance of the high-frequency voltage generator 6 and the impedance of the induction coil(s) 2 and the vacuum chamber 1a and/or the plasma produced therein, thus making it possible to obtain a highly effective coupling of the high-frequency power.

In connection with the present invention the concept of "high frequency" is used for electromagnetic vibrations or waves having a frequency between 10 kHz and 3 GHz. The high-frequency voltage generator 6 may work in a broad high-frequency spectrum from preferably 100 kHz to 100 MHz, more preferably between 100 kHz and 14 MHz and even more preferably between 400 kHz and 2 kHz.

The choice of a preferred frequency also depends on the geometry of the induction coil(s) 2. Thus, in the case of non-flat, three-dimensional induction coil(s) 2, as might be obtained, for example, when the coil windings are wound round the dielectric inner casing 7 and in which the high frequency energy is coupled into the vacuum chamber 1a via the volume of the space within the winding, the chosen frequency will preferably lie between 100 kHz and 2 MHz and especially between 200 kHz and 1 MHz. In the case of two-dimensional pancake coils, on the other hand, where the high-frequency energy is coupled into the vacuum chamber a via the area of the coil, the chosen frequencies will be rather higher, preferably between 2 MHz and 14 MHz. The preferred upper limiting value of this frequency range is due to the fact that the standard frequency of the high-frequency voltage generators most widely used in industry is 13.56 MHz. This frequency is approved for industrial use by international telecommunication agreements.

It has been found that the density distribution of the plasma can be influenced when a direct current is additionally applied to the induction coil(s) 2 and that, preferably, the uniformity of the plasma can be thereby improved, for example, over the surface of a substrate 9. To this end the induction coil 2 is also connected to a direct voltage generator 6', preferably through a low-pass filter 12. The low-pass filter 12, which may comprise, for example, a coil and a capacitor connected in parallel with it, is preferably designed in such a manner that the direct current can reach the induction coil 2 while the high-frequency current is blocked, so that the latter cannot find its way into the direct current source.

The direct current may be either uniform or modulated, for example, it may be pulsed in a unipolar or a bipolar manner. Bearing in mind the number of windings of the induction coil 2, the direct current will be set in such a manner that the product of the number of windings and the direct current will amount both on average and as an absolute value to between 10 and 1000 and preferably between 100 and 400 ampere windings. The number of windings of the induction coil 2 is preferably at least 7, but a minimum of 10 windings would be better and a minimum of 12 better still, since the current needed to render the density distribution of plasma uniform will increase as the number of windings diminishes, so that the demands made on the direct current generator 6' and the low-pass filter 12 will tend to become greater.

The plasma density distribution can be measured, for example, by using a Langmuir probe. Since in the case of sputter etching and reactive etching process, and possibly also in the case reactive coating processes, the uniformity of the plasma density distribution over the area of the substrate 9 affects the uniformity of the etching depth distribution and or the coating thickness distribution along, for example, a section through the substrate, the uniformity of the plasma density distribution may also be measured by measuring the distribution of the etching depth and/or the coating thickness.

In the case of a thermally oxidized silicon wafer, for example, the etching depth can be determined by using, for example, an ellipsometer to measure the thickness of the silicon oxide layer prior to the etching, for example, in a raster covering the entire surface of the silicon wafer or along a diameter of the silicon wafer. The thickness of the residual silicon oxide layer is then measured after the etching process has been completed. The etching depth follows from the difference between the thicknesses of the silicon layer before and after the etching process This procedure can be applied in an analogous manner to measure coating thicknesses.

The uniformity or evenness of the distribution of, for example, the etching depth, as also of the plasma density or the coating thickness, for example, along a section through the substrate 9 can be characterized by the so-called uniformity index, which is defined as Uniformity index=(Maximum value−Minimum value)/(Maximum value+Minimum value)

where the maximum value and the minimum value are, respectively, the largest and the smallest value of the characterizing distribution on, say, the entire surface area of the substrate 9 or along a section through the substrate. The uniformity index is usually stated as a percentage.

The direct current applied to the induction coil 2 is preferably chosen in such a manner as to make the uniformity index of the plasma density distribution, etching depth or coating depth, for example, along an arbitrarily chosen section through the substrate 9 or, for example, over a particular part of or the entire surface of the substrate 9 amount to not more than 10%, preferably not more than 7.5% and, even better, not more than 5%.

In yet another preferred embodiment of the device in accordance with the invention said device contains at least a pair of electrodes 5a, 5b separated by a certain distance. In the particular design of a vacuum processing chamber described in WO 00/19,483 the electrodes 5a, 5b may be formed, for example, by the metallic connections in the upper and lower cover wall of the vacuum recipient 1, these walls being galvanically separated from each other by the side walls made of dielectric material. U.S. Pat. No. 6,068,784 describes an arrangement of three electrodes in which the substrate table 8 serves as cathode and the side wall of the vacuum recipient as the anode, while the cover wall of the upper dome-shaped protuberance of the vacuum recipient constitutes a third electrode.

In a specially preferred embodiment one electrode 5a of the electrode pair 5a, 5b is formed by the substrate table 8 that the substrate 9 bears against and/or to which it is attached by means of the normally used electrostatic or mechanical holding and/or centering device (in the case of a wafer substrate sometimes referred to as wafer chuck). The substrate table itself will normally be electrically insulated from the casing 10 of the vacuum chamber. The counter-electrode 5b may be constituted, for example, by an electric connection in the upper cover wall or the end face of the vacuum chamber when such a connection is present. In a specially preferred variant the possibly circular substrate table 8 is surrounded by a ring that serves as counter-electrode and is usually described as dark space screening. The insulation between the substrate table 8 and the dark space screening in the upper part of the dark space screening is provided by the vacuum in the vacuum chamber 1a. In its lower part the dark space screening is fixed to the substrate table 8—though galvanically separated from it—in such a way as to be centered with respect to a ring-shaped ceramic insulator.

The electrode pair 5a, 5b may be connected, for example, to a direct voltage source, possibly pulsed in a unipolar or a bipolar manner, an alternating voltage source, or simultaneously to a direct and an alternating voltage source. The plasma is capacitatively excited by the voltage applied to the electrode pair 5a, 5b, which is also described as bias.

Preferably applied to the electrode pair 5a, 5b is a direct voltage or an alternating voltage, especially a high-frequency alternating voltage having a frequency between 100 kHz and 100 MHz. When selecting a suitable frequency of the alternating voltage, due account is preferably taken of the effects on the substrate 9 and/or the vacuum chamber 1a described in U.S. Pat. No. 6,068,784, column 4, lines 23-52; specific reference is here made to this discussion. In a preferred embodiment of the present invention, in which the substrate table 8 is used as electrode 5a and a dark space screening is used as counter-electrode 5b, the substrate table 8 is connected to a high-frequency voltage generator 11 with a frequency of preferably more than 3 MHz and, specially preferred, more than 10 MHz, while the dark space screening is grounded.

FIG. 1 shows a schematic section through a preferred embodiment of the device in accordance with the invention. The vacuum recipient 1 comprises a tank 10—which is made of, for example, stainless alloy steel and is capable of being evacuated—encloses the vacuum chamber 1a and contains a dielectric inner casing 7 made of, for example, quartz or aluminium oxide. The induction coil 2 is wound around the dielectric inner casing and is connected to the alternating voltage generator 6 through the adapter network 13 and also with the direct voltage generator 6' through the low-pass filter 12; the circuit is completed by grounding. The substrate table 8, which sustains the substrate 9 resting on it, serves as electrode 5a and is surrounded by a circular dark space screening, which is arranged in a centered position and acts as counter-electrode 5b. The vacuum chamber 1a is subject to the pumping action of a pump arrangement 4. The upper cover wall of the vacuum recipient 1 is provided with a gas inlet 3 situated at its centre.

In a concrete embodiment of the arrangement schematically illustrated by FIG. 1, which had been designed for processing a wafer having a diameter of 200 mm, the diameter of the dielectric inner casing amounted to 275 mm. The distance between the substrate table 8 and the upper cover wall of the vacuum recipient 1 was 180 mm. The induction coil 2 wound around the dielectric inner casing 7 had a diameter of 304 mm and consisted of 15 windings. Argon for sputter etching was fed into the chamber through the gas inlet 3, so that an operating pressure of $10^{-3}$ was attained. The biasing voltage applied to the substrate table 8, which served as electrode 5a, had a frequency of 13.56 MHz, while the dark space screening that served as counter-electrode was grounded. The induction coil 2 was connected to an alternating voltage generator 6 operated at 400 kHz through an adapter network 13 that consisted of two capacitors. The magnetic field induced by this arrangement in the inner space of the induction coil 2 amounted to about 5 Gauss. The induction coil 2 was also connected to a direct voltage generator through a low-pass filter 12 that consisted of a capacitor and a coil connected in parallel with it. The direct current, which was chosen in such a manner that the sputter etching depth distribution along a diameter of the wafer that served as substrate 9 had a uniformity index of less than ±3%, amounted to about 10 A and produced a magnetic field of about 12 Gauss.

Figure 2:
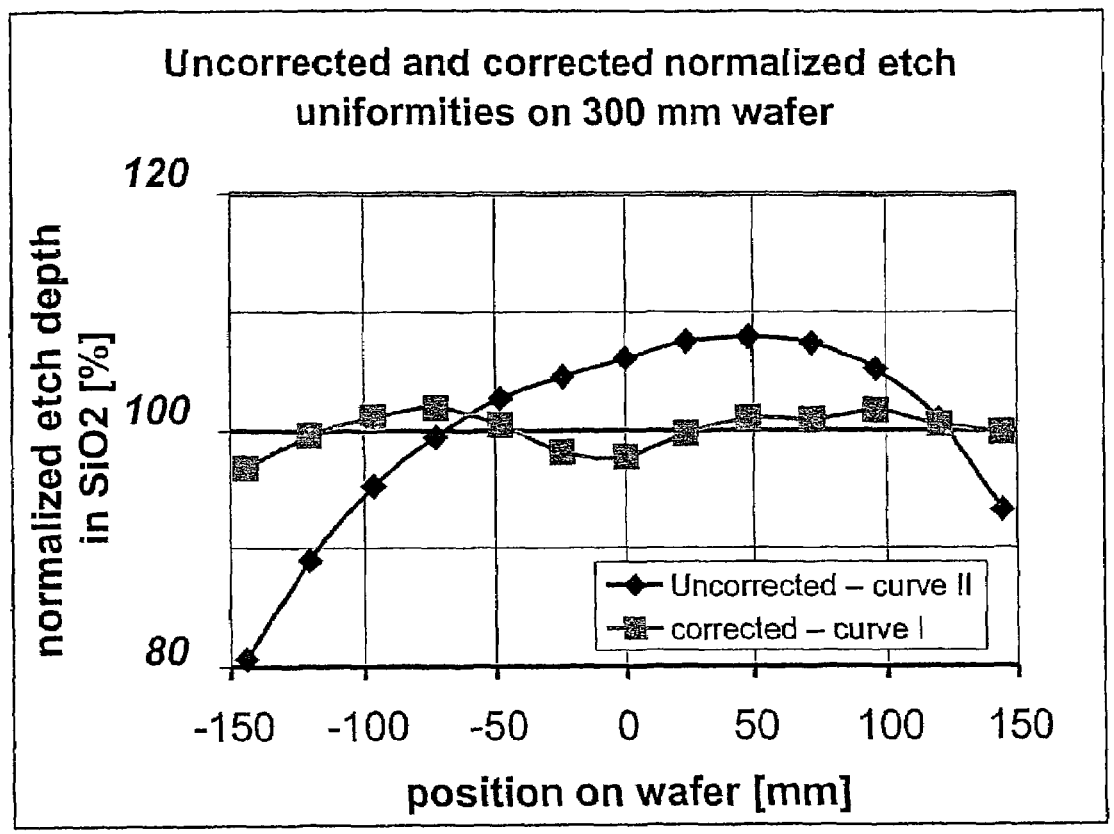
FIG. 2 shows the normalized etching depth along a diagonal of a silicon wafer, where the plasma used for the etching was at least co-produced by an induction coil carrying either a direct and an alternating current (Curve I) or merely an alternating current (Curve II).

FIG. 2 shows the normalized sputter etching depth distribution along a diameter of a circular silicon wafer having a diameter of 300 mm that had previously been subjected to thermal oxidation. The measurements were made under the operating conditions described in connection with FIG. 1 and in a similar device that had the geometric dimensions needed to accommodate a 300 mm wafer. Curve I shown in FIG. 2 was obtained for a procedure in accordance with the invention in which an alternating current and an additional direct current of about 10 A were applied to the induction coil 2. For comparison purposes, Curve II shows the sputter etching depth distribution that is obtained when only an alternating current is applied to the induction coil. It can be seen from Curve II that when only an alternating current is applied to the induction coil, the sputter etching depth diminishes as the edge of the wafer substrate 9 is approached; furthermore, the sputter etching depth distribution not symmetrical. Curve I shows that that the uniformity of the sputter etching depth distribution is clearly improved when an additional direct current is applied to the induction coil 2. To all intents and purposes the sputter etching depth distribution is no longer associated with any lack of symmetry. In particular, the reduction of the sputter etching depth towards the wafer edges observed in Curve II is now compensated. The homogenization of the plasma density distribution attained by means of the additionally applied magnetic field produced by the direct current reflects in a uniformity index of less than ±3%. If so desired, the amperage of the direct current can also be chosen so as to obtain an overcompensation of Curve II and therefore greater etching depths at the edges of the wafer than in the centre; in that case the uncompensated Curve II, which has a convex curvature, is in a certain sense "reversed" with respect to the compensated state in accordance with Curve I, so as to produce an overcompensated curve with a concave curvature.

In a preferred embodiment of the invention as a processing station the device in accordance with the invention can be a component of a so-called cluster. The term cluster is here understood as referring to a combination of several and often different processing stations that are served by a common transport device, a handling robot for example. A PVD (physical vapour deposition) plant might here be named as an example of a further processing station. The various processing stations are preferably separated from the transport space by means of appropriate sluicegates.

In such a cluster the transport device will be used to introduce the substrate 9 through a transfer sluicegate (not shown in FIG. 1) into the device in accordance with the invention The transport device deposits the substrate 9 on the substrate table 8, where it will be centered (if necessary) and appropriately retained. Following vacuum-tight closure of the sluicegate, the vacuum chamber is evacuated by means of the pumping arrangement 4; in parallel therewith or immediately afterwards the substrate 9 is brought to the desired processing temperature, possibly by means of tempering devices contained in the substrate table 8. The gas needed to produce the plasma is then fed into the chamber through the gas inlet 3. Thereafter the plasma is ignited by applying the high-frequency voltage to the induction coil 2 and the high-frequency bias to the substrate table 8. In parallel therewith the direct current is applied to the induction coil 2. Following completion of the desired processing, the substrate 9 is removed from the vacuum recipient 1 through the sluicegate.

The invention claimed is:

1. A procedure for the production of a plasma that is at least co-produced in the vacuum chamber (1a) of a vacuum recipient (1) of a device suitable for plasma processing with at least one induction coil (2) carrying an alternating current, where the gas used to produce the plasma is fed into the vacuum chamber (1a) through at least one inlet (3) and the vacuum chamber (1a) is subject to the pumping action of at least one pump arrangement (4), characterized in that a direct current is continuously applied during the plasma processing simultaneously with said alternating current to the induction coil (2) in order to influence the plasma density; and wherein said induction coil (2) is separated by means of a dielectric inner casing (7) or a dielectric window from at least the part of the vacuum recipient (1) in which the plasma is produced, the alternating current is produced by a high-frequency generator (6) operating at a frequency between 100 and 14,000 kHz, the plasma, is co-produced or co-excited by an electric voltage applied to at least one pair of electrodes (5a, 5b) separated by a certain distance, the vacuum chamber (1a) contains a substrate table (8) for a substrate (9), the substrate table (8) is formed by an electrode (5a) and a dark space screening is used as counter-electrode (5*b*).

2. A procedure in accordance with claim 1, wherein the electric voltage is an alternating voltage having a frequency of at least 1 MHz.

3. The procedure in accordance with claim 1, wherein the high frequency generator (6) operates at a frequency preferably between 400 and 2000 kHz, 4. The procedure in accordance with claim 1, wherein the electric voltage is a direct voltage pulsed in a unipolar or bipolar manner.

5. The procedure for the production of a plasma according to claim 1, wherein the gas is selected from the group consisting of argon, inert gases, chlorine, silicon tetrachloride, boron trichloride, carbon tetrafluoride, trifluoromethane, sulphur hexafluoride, oxygen, methane, silicon hydride, ammonia, nitrogen and hydrogen.

6. The procedure for the production of a plasma according to claim 1, wherein the induction coil is of a form selected from the group consisting of flat, pancake and planar coils.

7. A procedure in accordance with claim 1, wherein, the alternating current and the direct current are chosen in such a manner that the uniformity index of the plasma density in the plane of the substrate (9) and/or the planes parallel thereto is not greater than 10%.

8. The procedure in accordance with claim 7, wherein the alternating current and the direct current are chosen in such a manner that the uniformity index of the plasma density in the plane of the substrate (9) and/or the planes parallel thereto is not greater than 5%.

9. A procedure in accordance with claim 1, wherein the direct current is modulated.

10. The procedure in accordance with claim 9, wherein the direct current is modulated by being pulsed and is pulsed in a manner selected from the group consisting of unipolar and bipolar.

11. A procedure in accordance with any one of claims 1 and 9, wherein the direct current is applied to the induction coil (2) through a low-pass filter (12).

12. A procedure in accordance with anyone of claims 1 and 9, wherein the direct current and the number of windings of the induction coil (2) are chosen in such a manner that the product of the number of windings and the direct current will on average and as absolute value amount to between 10 and 1000 ampere windings.

13. The procedure in accordance with claim 12, wherein the product of number of windings and the direct current will on average and as absolute value amount to between 100 and 400 ampere windings.

14. A procedure in accordance with anyone of claims 1 and 9, wherein the pressure in the vacuum chamber (1*a*) amounts to between 0.01 and 10 Pa.

15. The procedure in accordance with claim 14, wherein the pressure in the vacuum chamber is between 0.05 and 0.2 Pa.

* * * * *